May 11, 1971 S. R. BORRELLO ET AL 3,578,515

PROCESS FOR FABRICATING PLANAR DIODES IN SEMI-INSULATING SUBSTRATES

Filed April 5, 1967 2 Sheets-Sheet 1

INVENTORS

SEBASTIAN R. BORRELLO
CHARLES G. ROBERTS

E. Mickey Hubbard
ATTORNEY

INVENTORS
SEBASTIAN R. BORRELLO
CHARLES G. ROBERTS
E. Mickey Hubbard
ATTORNEY 3,578,515
PROCESS FOR FABRICATING PLANAR DIODES IN SEMI-INSULATING SUBSTRATES Sebastian Ronald Borrello, Richardson, and Charles Grady Roberts, Dallas, Tex., assignors to Texas Instruments Incorporated, Dallas, Tex.

Filed Apr. 5, 1967, Ser. No. 628,613
Int. Cl. H01l 3/00, 5/00, 7/34
U.S. Cl. 148—175 13 Claims

ABSTRACT OF THE DISCLOSURE

A planar diode comprising a body of p-type indium arsenide (InAs) formed in a pocket in a substrate of semi-insulating gallium arsenide (GaAs) with the faces of the two semiconductors coplanar. A p-type cadmium (Cd) diffused region is formed in only a portion of the indium arsende which extends to one edge of the body of InAs. A first expanded contact is disposed directly on the GaAs substrate and extends onto the p-type Cd diffused region of the InAs body, and a second expanded contact is formed directly on the GaAs substrate and extends onto the InAs body that is still n-type.

The diode is fabricated by selectively etching a pocket in the GaAs substrate through a silicon dioxide ($SiO_2$) mask, epitaxially filling the pocket with InAs, removing the $SiO_2$ and lapping the surface of the GaAs substrate and InAs smooth, diffusing Cd through an $SiO_2$ diffusion mask, and forming the expanded contact by evaporation and photolithographic patterning.

This invention relates generally to semiconductor devices, and more particularly relates to a planarized diode and the process for fabricating the diode.

Conventional planar diodes have a diffused region of one conductivity type lying wholly within an active region of the other conductivity type. The resulting diode junction is generally cup-shaped and terminates at the surface around the entire perimeter of the diffused region. In order to make electrical contact with the diffused region without shorting the diffused region to the surrounding active region, an insulating layer, typically silicon dioxide, is disposed over the surface of the substrate and windows formed in the insulating layer over the diffused region and over the other active region. Separate expanded contacts are then formed on the surface of the oxide layer and extend through the windows into contact with the respective underlying region of the diode. It is also customary to make each diffusion through an oxide mask and to have each oxide mask in place and merely form each successive oxide mask over the previously existing oxide masks. The surface of the resulting structure is very irregular due to the steps formed at the edge of the openings of each oxide layer, as well as the normal surface irregularities resulting from growth of the oxide. The resulting irregular surface causes problems in the fabrication of the metallized film leads used for the expanded contacts of the diode, or for connecting the diode in an integrated circuit.

An object of this invention is to provide a planar diode structure having a truly flat upper surface upon which evaporated expanded metal contacts can be easily formed.

Another object is to provide a diode having improved impedance values due to the elimination of the silicon dioxide insulating layer which tends to partially short the diode junction.

A further object is to provide a light sensitive device having no insulating layer over the surface which would otherwise tend to reduce the light reaching the optically active region.

These and other objects are accomplished in accordance with the present invention by epitaxially forming a body of active semiconductor material in a pocket etched in a semi-insulating semiconductor substrate. The surface of the body is then lapped flush with the surface of the substrate and a diffusion mask formed over the substrate which exposes only a portion of the body of active semiconductor material and extends over the semi-insulating stubstrate. A diffusion is made through the mask into the active semiconductor region to form the diode junction. Due to the much lower diffusion rate in the semi-insulating substrate, the electrical characteristics of the semi-insulating substrate exposed through the diffusion mask are not materially altered. The diffusion mask is then removed and the metallized contacts formed on the surface of the substrate.

The resulting diode comprises a body of active semiconductor material surrounded by the semi-insulating substrate with the surfaces of the active body and the semi-insulating substrate copolanar, a diffused region formed in the active semiconductor body and extending to one edge of the body, and expanded metal contacts disposed directly on the surface of the semi-insulating substrate and extending into contact with the diffused region and the non-diffused region of the active semiconductor body.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
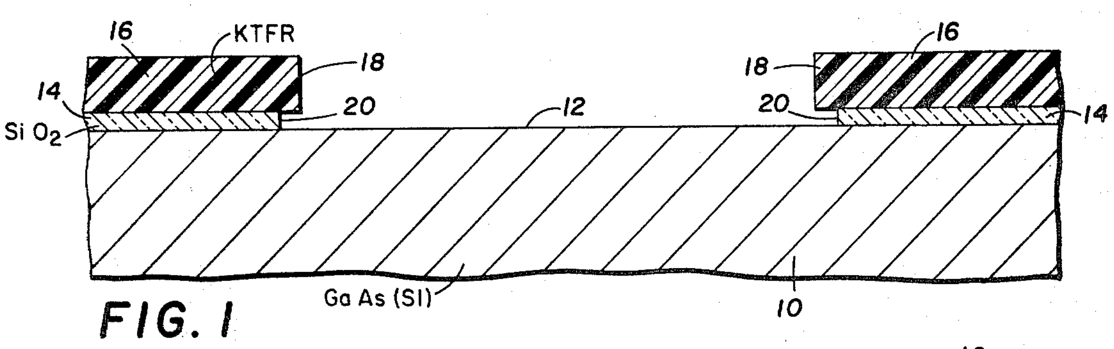
FIGS. 1–7 are somewhat schematic sectional views with the vertical dimension greatly exaggerated whtich serve to illustrate steps of the process of the present invention.

Referring now to the drawings, the starting materal for the process of the present invention is a semi-insulating or high resistivity substrate 10. A semi-insulating material has been defined in the art, G. R. Cronin and R. W. Haisty, "The Preparation of Semi-Insulating Gallium Arsenide by Chromium Doping," Journal of the Electrochemical Society, vol. 111, No. 7, July 1964, to be a material having a resistivity in the range of $10^4$–$10^{12}$ ohm-centimeters. As used herein, the term "semi-insulating material" refers to a material having a resistivity in this range. For example, the substrate 10 may be chromium doped semi-insulating gallium arsenide having a resistivity greater than about $10^6$ ohm-centimeter. However, any other very high resistivity substrate having a crystal lattice structure which will promote the epitaxial growth of active semi-conductor material can be used. For example, sapphire, aluminum trioxide ($Al_2O_3$) or silicon doped with deep impurities such as gold and having a high resistivity at very low temperatures can be used in accordance with the broader aspects of the present invention.

The entire surface 12 of the substrate 10 is coated with a silicon dioxide layer 14 using any suitable conventional process, such as the thermal decomposition of tetraethyl orthosilane (TEOS). The silicon dioxide layer 14 is typically about 5,000 angstrom units thick. Next a coat 16 of etch resist, such as Kodak thin film resist (KTFR), is formed over the oxide layer 14, exposed, and developed to open a window 18. Then the substrate is exposed to hydrofluoric acid (HF) to etch a window 20 in the oxide layer 14. This results in the structure illustrated in FIG. 1.

Then without removing the KTFR coat 16, the substrate is subjected to an etching solution for selectively attacking the gallium arsenide substrate 10. A 5% solution of bromine in methanol may be used for this purpose. The etch fluid is preferably continually sprayed onto the substrate using nitrogen gas as the carrier. As a result, a pocket 22 is formed in the gallium arsenide substrate 10 which is typically about 0.0015 inch deep and about 0.020 inch square. Improved definition of the pocket 22 is obtained by leaving the KTFR layer 16 in place during the etch process to support the very thin silicon dioxide layer 14. If the KTFR coat 16 is removed, the thin silicon dioxide layer breaks away in an irregular pattern as it is undercut by the etching fluid which results in a pocket having irregular edges.

Figure 3:
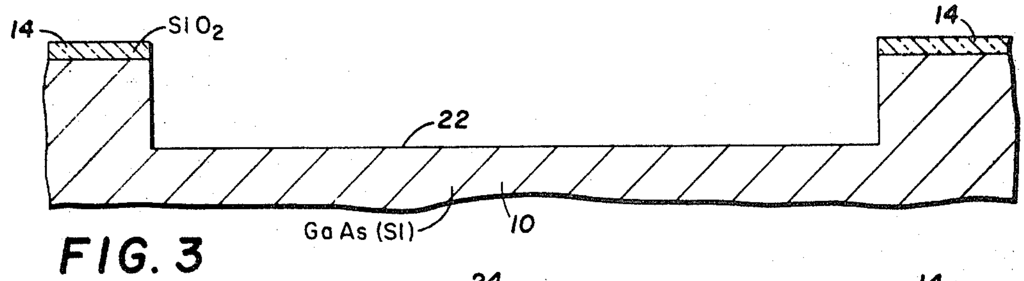

Next the KTFR coat 16 is removed by the standard stripping solution (Kodak J–100), and parts of the silicon dioxide layer 14 which overhang the pocket 22 break away, leaving the structure illustrated in FIG. 3.

Figure 4:
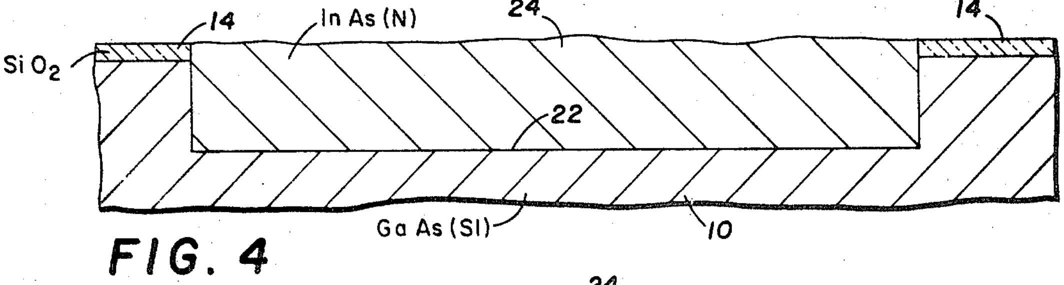
Figure 5:
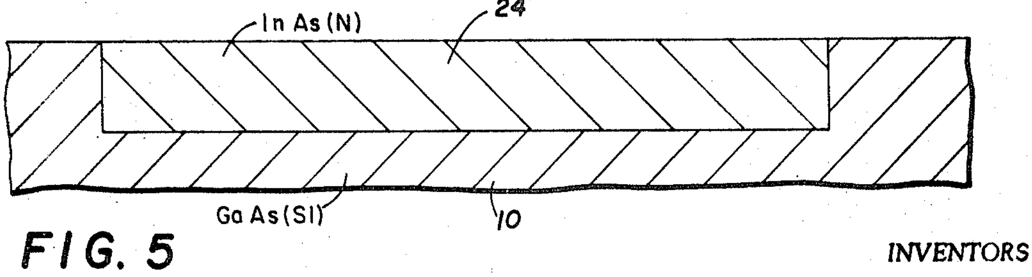
Figure 6:
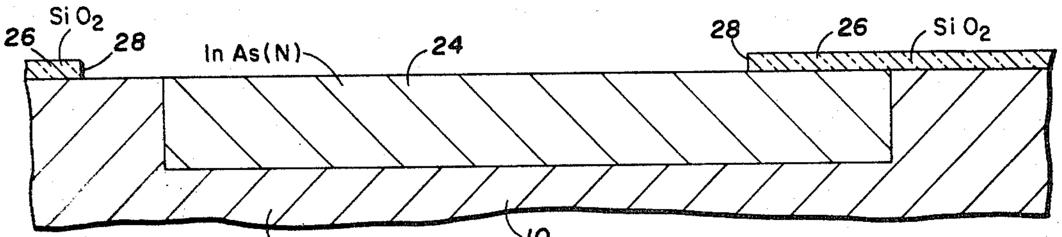

Next a single crystal semiconductor body 24 i s epitaxially grown in the pocket 22.The doping level of the semiconductor body 24 is selected to form one region of the diode. In accordance with a specific aspect of the invention, n-type indium arsenide (InAs) having an impurity concentration of about $2\times10^{6}$ atoms/cc. and a resistivity of about $1.5\times10^{-2}$ ohm-centimeters is epitaxially grown in the pocket 22 using substantially the process described in the article "Epitaxial Indium Arsenide on Semi-Insulating Gallium Arsenide Substrate," by G. R. Cronin et al. published on page 1336 of the Journal of the Electro Chemical Society, vol. 113, No. 12, December 1966. The pocket 22 should be at least filled with indium arsenide 24, substantially as illustrated in FIG. 4. Excess filling of the pocket or growth of InAs on the silicon dioxide layer 14 is not over detrimental.

Next the silicon dioxide layer 14 is removed using hydrofluoric acid and the surface of the substrate chemically polished until nearly optically flat. The surface of the substrate can be chemically polished by moving the surface across a smooth surface of paper in the presence of an etching fluid such as a solution comprising 1% bromine and the remainder methanol. This results in a body of indium arsenide 24 having a low excess carrier concentration suitable for one region of a diode that is isolated within a semi-insulating gallium arsenide substrate, with the surface of the indium arsenide body being coplanar with the surface of the gallium arsenide substrate.

Next a diffusion mask is formed on the surface of the substrate 10 by depositing and photolithographically patterning a silicon dioxide layer 26 using KTFR and hydrofluoric acid (HF) in the conventional manner. The mask has an opening 28 which can be seen in the plan view of FIG. 9. It will be noted that the opening 28 exposes only a portion of the indium arsenide body 24, and extends over the adjacent portions of the gallium arsenide substrate around three edges of the indium arsenide crystal 24. The KTFR is removed from the silicon dioxide layer using a conventional stripping solution before the diffusion step presently to be described.

Next a p-type impurity is diffused through an opening 28 in the silicone dioxide mask 26 into the exposed portion of the indium arsenide. Although we believe that cadmium is the optimum impurity for this purpose, zinc or magnesium may also be used. The cadmium is preferably diffused using a quartz vacuum capsule in a dual temperature diffusion furnace in which a 20% cadmium 80% indium alloy source is maintained at 675° C. and the substrate is maintained at 700° C. Surface concentrations of $5\times10^{17}$ atoms/cc. can be achieved using such a process.

Figure 7:
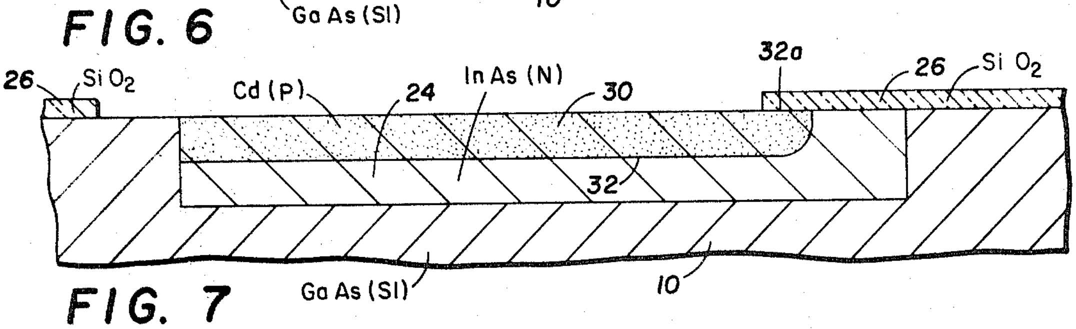
Figure 8:
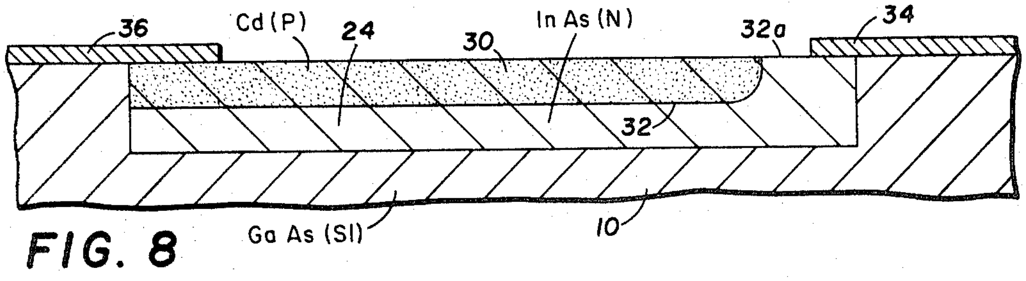
FIG. 8 is a sectional view of a diode fabricated in accordance with this invention.
Figures 9, 10:
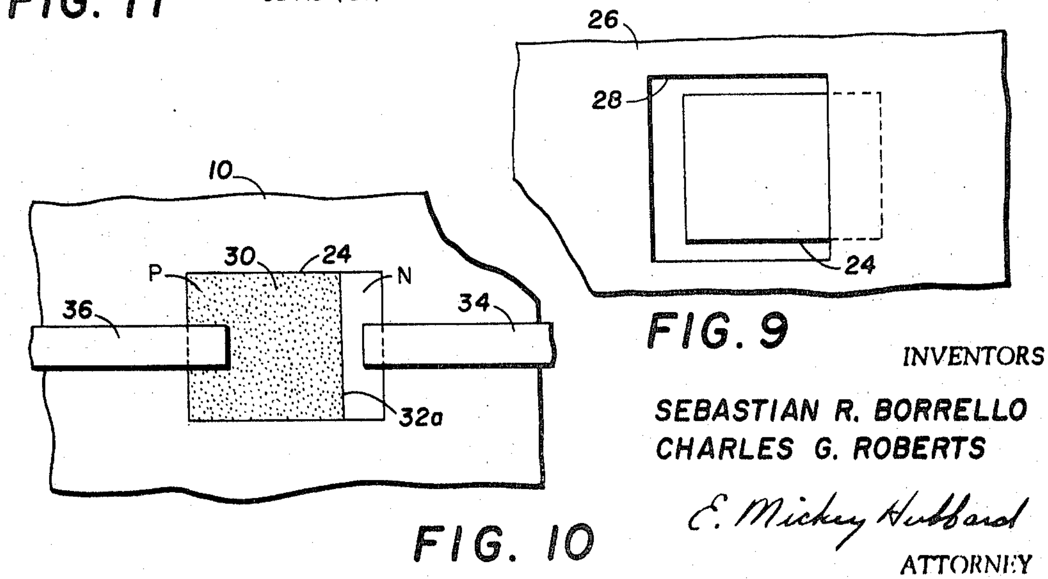
FIG. 9 is a plan view of the structure as shown in FIG. 6.
FIG. 10 is a plan view of the completed diode illustrated in the sectional view of FIG. 8.

As a result of the diffusion step, a cadmium doped p-type diffused region 30 is formed in only a portion of the indium arsenide crystal 24 as shown in FIGS. 7, 8 and 10. A P-N junction, represented at 32, is formed and extends generally parallel to the upper surface of the indium arsenide crystal 24 over the entire area of the indium arsenide crystal that was exposed through the diffusion mask, as represented by the stippled area in FIG. 10. The junction 32 extends to the surface of the indium arsenide crystal only along the line 32*a*. The electrical characteristics of the portion of the gallium arsenide substrate 10 that was exposed through the opening 28 in the silicon dioxide diffusion mask 26 remains unaffected by the diffusion step. Since the rate of diffusion of cadmium into indium arsenide in orders of magnitude greater than the rate of diffusion of cadmium into gallium arsenide, very little cadmium diffuses into the gallium arsenide during the period required to diffuse the cadmium to the desired depth in the indium arsenide crystal 24. Further, the gallium arsenide substrate 10 is heavily doped with chromium, which would require a very high cadmium doping level to convert its conductivity characteristics. As a result, the P-N junction 32 is formed only within the indium arsenide crystal 24.

After the diffusion step, the silicon dioxide mask 26 is removed from the substrate using hydrofluoric acid, then a metallic film about 5,000 angstrom units thick is deposited by evaporation or other suitable teachnique over the entire surface of the substrate. The metallic film may be aluminum, gold, any of the transition metals, kovar, or substantially any other metal that can be evaporated. The metallic film is then patterned to form a first expanded contact 34 which extends from the gallium arsenide substrate 10 over the portion of the indium arsenide crystal 24 that is not doped with cadmium and which is therefore n-type, and a second expanded contact 36 which extends from the gallium arsenide substrate 10 over the cadmium doped p-type region 30. The semi-insulating gallium arsenide substrate provides electrical isolation between the expanded contacts 34 and 36.

Figure 2:
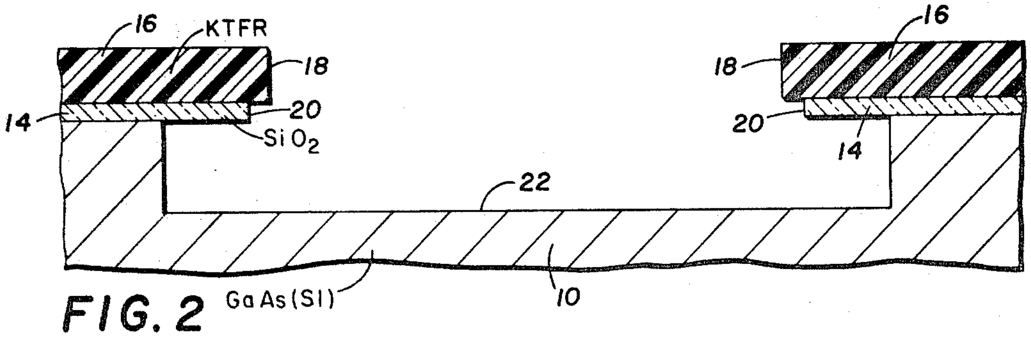
Figure 11:
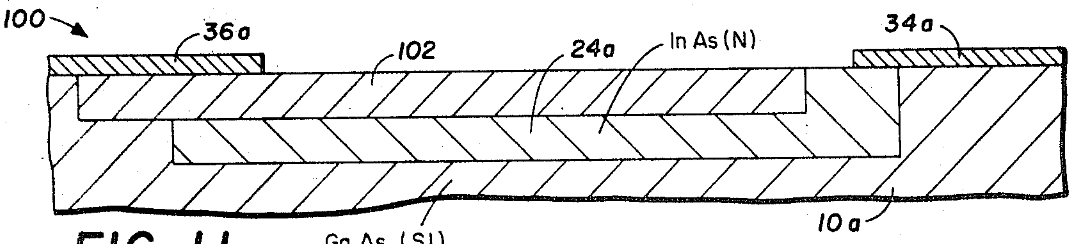
FIG. 11 is a sectional view similar to FIG. 8 of another diode constructed in accordance with this invention.

An alternative embodiment of this invention is indicated generally by the reference numeral 100 in FIG. 11, wherein corresponding parts are designated by the same reference numerals followed by the reference character *a*. The device 100 may be fabricated using the same process steps illustrated in FIGS. 1–6, except that the photo resist layer is left on the silicon dioxide mask 26 so as to form an etching mask of the type illustrated in FIG. 2. The device at the point is comprised of the semi-insulating substrate 10*a* and the epitaxially formed n-type crystal 24*a*. Then a pit is etched throughout the mask, the photo resist layer removed, and the pit refilled, the $SiO_2$ layer then removed, and the substrate lapped smooth using the same process heretofore described in connection with FIGS. 2–5, except that the crystal is doped with a p-type impurity, such as cadmium (Cd). This results in a p-type crystal 102 which extends at least to the edge of the n-type crystal 24*a* and actually into the GaAs substrate at the edge of the crystal 24*a*. Contacts 34*a* and 36*a* are then formed in the same manner as previously described. An important advantage of this alternative embodiment of the process is that the diffusion rate in the substrate 10*a* need not be much slower than the diffusion rate in the crystal 24*a*, thus permitting the use of a much wider range of semiconductor materials to fabricate the diode. As a further alternative, the n-type region 24*a* may be formed by diffusion, rather than by etching and refilling, if desired.

Although preferred embodiments of the invention have been described in detail, it is to be understood that various changes, substitutions and alternations can be made therein without departing from the spirit and scope of the appended claims.

What is claimed is:

1. A method of fabricating a semi-conductor device which comprises:

etching a pocket in the surface of a semi-insulating substrate of one conductivity type and having a resistivity greater than range $10^4$ ohm-centimeters, epitaxially growing in said pocket an active semiconductor crystal of said one conductivity type and having a resistivity substantially less than the resistivity of said substrate, said substrate having a diffusion rate with respect to a pre-selected dopant that is substantially less than the diffusion rate of said semiconductor crystal with respect to said dopant, forming on the substrate a diffusion mask which contains an opening over a portion of the semiconductor crystal and a portion of the substrate adjacent that portion of said crystal, depositing said preselected dopant through said opening in said diffusion mask onto the exposed portions of the active semiconductor crystal and the substrate and diffusing an effective doped area of opposite conductivity type in said semiconductor crystal, said doped area having a resistivity substantially less than the resistivity of said substrate, removing the diffusion mask, and depositing a pair of contacts on the surface of said substrate, one of said contacts partially extending over the doped area of the semiconductor crystal and the other of said contacts partially extending over the undoped area of said crystal.

2. The method defined in claim 1 wherein the substrate is gallium arsenide, the crystal is indium arsenide, and the resistivity is greater than $10^6$ ohm-centimeters.

3. The method of claim 1 wherein n-type indium arsenide having an impurity concentration of about $2\times10^{16}$ atoms/cc. and a resistivity of about $1.5\times10^{-2}$ ohm-centimeters is epitaxially grown into the pocket of the chromium doped semi-insulating gallium arsenide substrate.

4. The method of claim 1 wherein the doping impurity is taken from the group consisting of cadmium, zinc, and magnesium.

5. The method of claim 1 wherein the semi-insulating substrate is a material taken from the group consisting of sapphire, and silicon doped with deep impurities such as gold.

6. A method of fabricating a semiconductor device which comprises:

epitaxially growing an active semiconductor crystal in a pocket of a semi-insulating substrate of one conductivity type and having a resistivity greater than $10^4$ ohm-centimeters, depositing a pre-selected dopant onto a portion of said active semiconductor crystal and an area of said substrate adjacent said portion of said crystal, said substrate having a diffusion rate with respect to said pre-selected dopant that is substantially less than the diffusion rate of said semiconductor crystal with respect to said dopant, and diffusing an effective doped area of opposite conductivity type in said portion of said semiconductor crystal, said doped area having a resistivity substantially less than the resistivity of said substrate, and forming a pair of contacts directly on the surface of said substrate, one of said contacts partially extending over the doped area of said semiconductor crystal and the other of said contacts partially extending over the undoped area of said crystal.

7. A method of fabricating a semiconductor device which comprises:

forming an etching mask on a semi-insulating substrate of one conductivity type and having a resistivity greater than $10^4$ ohm-centimeters, etching a pocket in said substrate through the etching mask, growing an active semiconductor crystal in said pocket of said substrate of said one conductivity type, said semiconductor crystal having a resistivity substantially less than the resistivity of said substrate, and said substrate having a diffusion rate with respect to a pre-selected dopant that is substantially less than the diffusion rate of said semiconductor crystal with respect to said dopant, removing said etching mask from said substrate, forming a diffusion mask having an opening over a portion of said semiconductor crystal and extending over a portion of said substrate adjacent said portion, depositing a preselected dopant through said opening in said diffusion mask onto said semiconductor crystal and the exposed area of said substrate and diffusing an effective doped area of opposite conductivity type in said semiconductor crystal having a resistivity substantially less than the resistivity of said substrate, removing said diffusion mask, and forming a pair of expanded contacts on the surface of said substrate, one of said contacts partially extending over the doped area of said crystal and the other contact partially extending over the undoped area of said crystal.

8. The method of claim 7 including the step of polishing the surface of said semi-insulating substrate and semiconductor crystal after removal of said etching mask to produce a semiconductor crystal surface which is coplanar with the semi-insulating substrate surface.

9. The method of claim 7 wherein said semi-insulating substrate is chromium doped semi-insulating gallium arsenide having a resistivity greater than about $10^6$ ohm-centimeters, and the crystal is n-type indium arsenide having an impurity concentration of about $2\times10^{16}$ atoms/cc. and a resistivity of about $1.5\times10^{-2}$ ohm-centimeters epitaxially grown into the pocket of said semi-insulating substrate.

10. The method of claim 9 wherein the doping impurity is taken from the group consisting of cadmium, zinc, and magnesium.

11. The process for fabricating a semiconductor device, comprising:

selectively etching a pit in the surface of a semi-insulating semiconductor substrate of one conductivity type and having a resistivity greater than $10^4$ ohm-centimeters, epitaxially refilling said pit with a first semiconductor crystal of said one conductivity type, selectively etching a second pit in a portion of the first semiconductor crystal which extends into said substrate at one edge of said first semiconductor crystal, epitaxially refilling said second pit with a second semiconductor crystal of opposite conductivity type, and forming first and second expanded metal contacts directly on the surface of said substrate which extend over said first and second semiconductor crystals, respectively.

12. The process defined in claim 11 wherein the substrate is gallium arsenide, and the first and second crystals are indium arsenide.

13. The process defined in claim 11 wherein the surface of the substrate is lapped after the first semiconductor crystal is grown and after the second semiconductor crystal is grown.

References Cited

UNITED STATES PATENTS

| | | | |
|---|---|---|---|
| 3,308,354 | 3/1967 | Tucker | 317—234 |
| 3,331,001 | 7/1967 | Luce et al. | 317—235 |
| 3,371,213 | 2/1968 | Adams et al. | 148—33.5X |
| 3,372,069 | 3/1968 | Bailey et al. | 148—175 |
| 3,375,145 | 3/1968 | Setchfield et al. | 148—177 |

(Other references on following page)

UNITED STATES PATENTS

| | | | |
|---|---|---|---|
| 3,381,182 | 4/1968 | Thornton | 317—234 |
| 3,386,864 | 6/1968 | Silvestri et al. | 148—175 |
| 3,436,548 | 4/1969 | Biard et al. | 317—235X |
| 3,443,169 | 5/1969 | Foxell et al. | 317—234 |
| 3,476,617 | 11/1969 | Robinson | 148—175 |
| 3,171,762 | 3/1965 | Rutz | 148—175 |
| 3,234,058 | 2/1966 | Marinace | 148—174X |
| 3,243,323 | 3/1966 | Corrigan et al. | 156—17X |
| 3,316,128 | 4/1967 | Osafune et al. | 148—175UX |
| 3,370,995 | 2/1968 | Lowery et al. | 148—175 |
| 3,393,088 | 7/1968 | Manasevit et al. | 117—106 |
| 3,397,448 | 8/1968 | Tucker | 29—577 |
| 3,413,145 | 11/1968 | Robinson et al. | 117—201 |

L. DEWAYNE RUTLEDGE, Primary Examiner

W. G. SABA, Assistant Examiner

U.S. Cl. X.R.

29—578, 589; 117—106, 201; 148—33.5; 317—234